(12) United States Patent
Piret

(10) Patent No.: US 7,069,492 B2
(45) Date of Patent: Jun. 27, 2006

(54) METHOD OF INTERLEAVING A BINARY SEQUENCE

(75) Inventor: Philippe Piret, Cesson-Sevigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 434 days.

(21) Appl. No.: 10/386,722

(22) Filed: Mar. 13, 2003

(65) Prior Publication Data

US 2003/0177430 A1 Sep. 18, 2003

(30) Foreign Application Priority Data

Mar. 13, 2002 (FR) .................................... 0203115

(51) Int. Cl.
*H03M 13/00* (2006.01)

(52) U.S. Cl. ....................... 714/762; 714/788; 714/701; 714/755; 714/786

(58) Field of Classification Search ........ 714/786–788, 714/701, 755, 761, 762
See application file for complete search history.

(56) References Cited

U.S. PATENT DOCUMENTS

| 5,905,739 | A | 5/1999 | Piret et al. |
| 6,438,112 | B1 | 8/2002 | Piret et al. ................... 370/298 |
| 6,543,013 | B1* | 4/2003 | Li et al. ..................... 714/701 |
| 6,543,021 | B1 | 4/2003 | Piret ......................... 714/752 |

(Continued)

FOREIGN PATENT DOCUMENTS

EP 1 098 445 A 5/2001

(Continued)

OTHER PUBLICATIONS

J. Yuan et al., "Design of Cyclic Shift Interleavers For Turbo Codes Structure," Annals Of Telecommunications, vol. 56, No. 7/8, Jul. 2001, pp. 384-393.

*Primary Examiner*—Guy J. Lamarre
(74) *Attorney, Agent, or Firm*—Fitzpatrick, Cella, Harper & Scinto

(57) ABSTRACT

To interleave a binary sequence $\underline{a}$ represented by the polynomial $$a(x) = \sum_{i=0}^{n-1} a_i x^i,$$

where $n = R.M$ with $R \geq M$, i being an integer which may be written $i = r.M+c$, r and c being integers, $r \geq 0$ and $c \in [0, M-1]$, there is obtained, from the sequence $\underline{a}$, an interleaved binary sequence $\underline{a}^*$. The interleaved binary data sequence $\underline{a}^*$ represented by the polynomial $$a^*(x) = \sum_{i=0}^{n-1} a_i x^{i^*}$$

where $i^* = [r - h(c)].M + c \mod n$, the $h(c)$ being obtained by the choice of an M-tuple $\underline{h}_0 = [h_0(0), \ldots, h_0(M-1)]$ of non-negative integers less than R−1 such that, given a predetermined set Π of circulating matrices P of dimension M×M, for any matrix P of Π, the residues modulo R of the components of the vector $\underline{h}_0.P$ are not nil; and the corresponding choice of an M-tuple $\underline{h}$ obtained from $\underline{h}_0$ by the application of a permutation moving $h_0(c)$ to position L×c mod M, the integer L being relatively prime with M. (It is noted that the above underlining of the variables, and the above single bracketing, is in the original and is meant to be permanent.)

32 Claims, 5 Drawing Sheets

U.S. PATENT DOCUMENTS

| | | | |
|---|---|---|---|
| 6,560,362 B1 * | 5/2003 | Piret et al. | 382/232 |
| 6,578,170 B1 | 6/2003 | Piret et al. | 714/758 |
| 6,578,171 B1 | 6/2003 | Braneci et al. | 714/786 |
| 6,638,318 B1 | 10/2003 | Piret et al. | 718/781 |
| 6,785,859 B1 * | 8/2004 | Goldman | 714/755 |
| 2002/0099997 A1 | 7/2002 | Piret | 714/781 |

FOREIGN PATENT DOCUMENTS

| | | |
|---|---|---|
| EP | 01 098445 A1 | 5/2001 |
| FR | 2 804 806 A | 8/2001 |
| FR | 01 11479 | 9/2001 |

* cited by examiner

METHOD OF INTERLEAVING A BINARY SEQUENCE

This application claims the right of priority under 35 U.S.C. § 119 based on French patent application No. 02 03115, filed on Mar. 13, 2002, which is hereby incorporated by reference herein in its entirety as if fully set forth herein.

The present invention relates to a method of interleaving a binary sequence.

It concerns communication systems in which, in order to improve the faithfulness of the transmission, the data to be transmitted are subjected to a channel encoding. It is described herein by way of non-limiting example in its application to turbocodes.

It will be recalled that so-called "channel" encoding consists, when the "codewords" sent to the receiver are formed, of introducing a certain amount of redundancy in the data to be transmitted. At the receiver, the associated decoding method then judiciously uses this redundancy to detect any transmission errors and if possible to correct them.

The Hamming distance between two binary sequences having same length is defined as being the number of locations where the two sequences have a different binary element. The codewords obey certain rules defined by the encoding method considered, which enables the receiver to replace the codeword received with the codeword (thus belonging to the dictionary of codewords) situated at the shortest Hamming distance from this received word.

The greater the minimum Hamming distance between the various codewords, the more reliable is this error correction procedure. However, it is well known that for a linear code, this minimum distance is equal to the minimum weight of the non-nil codewords, the weight being the number of binary elements equal to 1. An encoding method using a linear code will thus be all the better, all other things being equal, if the minimum of the weights of its non-nil words is high.

Furthermore, the transmission error correction is all the more effective when the channel code used has a low percentage of codewords whose weight is close to the minimum distance of the code. In certain cases, better results are even obtained with a code whose words almost all have a weight appreciably greater than the minimum distance of this code, than with another code with a greater minimum distance, but in which many words have a weight scarcely greater than this minimum distance.

The object of the present invention is in particular to make it possible to construct channel codes each benefiting from a large minimum distance, and in which the majority of the words have a weight appreciably greater than this minimum distance.

Among the known encoding methods, some are known as "cyclic redundancy codes". In such a method, a so-called "generator polynomial" $g(x)$ is chosen, with binary coefficients, of degree d and of constant term equal to 1. Each information sequence to be transmitted, possibly extending it with nil elements, is put in the form of a binary sequence $u$ having a fixed length l. Then a sequence $a$ is formed by extending the sequence $u$ by means of a number of bits equal to d, these so-called "padding bits" being chosen so that the polynomial $$a(x) = \sum_{i=0}^{l+d-1} a_i x^i$$

associated with $a$ is divisible by $g(x)$ (modulo 2). These are the sequences $a$ of length n=l+d which are sent to the receiver. If the demodulation of the signals received is "hard", that is to say if the signals received are directly labeled on reception by one of the two binary symbols, the transmission errors may be detected by examining the remainder of the division of the polynomial representing the word received by the generator polynomial.

Very effective encoding methods, known as turbocodes, have been proposed recently, in which the redundancy is increased by transmitting, for each sequence $u$ of initial "information" data, in addition to the sequence $u$ itself, several supplementary sequences known as "parity sequences", each of these parity sequences resulting from the passage of the sequence $u$ through an "elementary" encoder (or a series of several successive elementary encoders) corresponding to this "parity".

A description will now be given of a particularly advantageous class of turbocodes with two parities. According to these turbocodes, three sequences $a$, $b$ and $c$ obtained as follows are transmitted for each sequence $u$ of initial data.

The sequence b is produced by a first encoder, usually on the basis of the polynomial representation $b(x)=a(x).f_1(x)/g(x)$ where $a(x)$ is the polynomial associated with the sequence $a$, $g(x)$ is a first predetermined polynomial with binary coefficients of degree d and of constant term equal to 1, and $f_1(x)$ is a second predetermined polynomial with binary coefficients not having a common divisor with $g(x)$. The polynomial $g(x)$ is termed the "feedback polynomial" for reasons related to the concrete performance of the division by $g(x)$ implied by the expression of $b(x)$.

As for the sequence $a$, this can be taken to be identical to $u$, but is preferably obtained, as in cyclic redundancy codes, by extending the sequence $u$ by means of padding bits chosen so that $a(x)$ is divisible by $g(x)$. Let n be the length of $a(x)$. In practice, n=r.m will be chosen, where m is the smallest strictly positive integer such that $g(x)$ divides $(x^m+1)$ and where r is a strictly positive integer.

The sequence $c$ is produced by a second encoder, usually on the basis of the polynomial representation $c(x)=a^*(x).f_2(x)/g^*(x)$, where $g^*(x)$ is a third predetermined polynomial with binary coefficients of degree d and of constant term equal to 1, where $f_2(x)$ is a fourth predetermined polynomial with binary coefficients, not having a common divisor with $g^*(x)$, and where the polynomial $a^*(x)$ represents a binary sequence $a^*$ which results in a predetermined manner from a permutation of the binary elements of $a$ or of $u$ (with or without addition of parity bits), this operation also being called interleaving. In what follows, it is assumed that $g(x)=g^*(x)$. The general case in which $g^*(x) \neq g(x)$ does not present any particular difficulties with respect to the case dealt with.

The turbodecoding of the message received operates in the following manner: the decoder receives three sequences of numbers, denoted $a'$, $b'$ and $c'$, and which were produced by the action of the transmission channel noise on the transmitted sequences $a$, $b$ and $c$. The turbodecoder then implements an iterative process using $b'$ and $c'$ alternately, intended to calculate an estimated value $â$ of a with a reliability which increases with the number of iterations chosen. If padding ts have been used, it suffices, once the final value of $\underline{\hat{a}}$ has been obtained, to eliminate these padding bits to obtain the estimated value $\underline{\hat{u}}$ of $\underline{u}$.

A reminder will now be given of the concept of wheel interleaver.

An integer N=R.M being fixed with R≧M, the set of binary sequences $$u(x) = \sum_{i=0}^{N-1} u_i x^i$$

is associated with the matrix U of dimensions R×M having the number jM+k in position (j,k), $0 \leq j \leq R-1$, $0 \leq k \leq M-1$. For example, for R=7 and M=5, N=R.M=35 and the matrix U is given by $$U = \begin{bmatrix} 0 & 1 & 2 & 3 & 4 \\ 5 & 6 & 7 & 8 & 9 \\ 10 & 11 & 12 & 13 & 14 \\ 15 & 16 & 17 & 18 & 19 \\ 20 & 21 & 22 & 23 & 24 \\ 25 & 26 & 27 & 28 & 29 \\ 30 & 31 & 32 & 33 & 34 \end{bmatrix}$$

Next, for an M-tuple $\underline{h}=[h_0, \ldots, h_{M-1}]$ of integers, a circular downwards permuntation of amplitude $h_j$ on the $j^{th}$ column of U is applied for all j. The matrix obtained is denoted U*. Thus, if U is the above matrix and if $\underline{h}=[0\ 2\ 5\ 1\ 3]$, the matrix U* is given by $$U^* = \begin{bmatrix} 0 & 26 & 12 & 33 & 24 \\ 5 & 31 & 17 & 3 & 29 \\ 10 & 1 & 22 & 8 & 34 \\ 15 & 6 & 27 & 13 & 4 \\ 20 & 11 & 32 & 18 & 9 \\ 25 & 16 & 2 & 23 & 14 \\ 30 & 21 & 7 & 28 & 19 \end{bmatrix}$$

To the pair (U,U*), or equivalently to the M-tuple $\underline{h}$, the interleaver is associated which produces, from any sequence $u(x)=u_0+u_1x+ \ldots +u_{34}x^{34}$, the interleaved sequence $u^*(x)=u_0+u_1x^{26}+u_2x^{12}+ \ldots +u_{34}x^{19}$, which may be re-written in the form $u^*(x)=u_0+u_{11}x+u_{27}x^2+ \ldots +u_{14}x^{34}$. More generally, a wheel interleaver of size R.M defined by $\underline{h}=[h_0, \ldots, h_{M-1}]$ produces, from the sequence $$u(x) = \sum_{K=0}^{M-1} x^K u^{(K)}(x^M) \qquad (1)$$

where $u^{(K)}(x)$ is the degree R−1, the interleaved sequence $$u^*(x) = \sum_{K=0}^{M-1} x^{K-h_K M} u^{(K)}(x^M) \text{ modulo } x^{RM} - 1. \qquad (2)$$

Let us now apply the wheel interleavers to the turbocodes. As was seen earlier, a binary rate 1/3 turboencoder is characterized by three polynomials g(x), $f_1(x)$ and $f_2(x)$ with binary coefficients, a frame length n and an interleaver, as shown in FIG. 1. If a(x) is a polynomial with binary coefficients representing the information, the turboencoder produces, in addition to the sequence a(x) itself, the sequences $b(x)=a(x)f_1(x)/g(x)$ and $c(x)=a^*(x)f_2(x)/g(x)$, where $a^*(x)$ is the polynomial representation of the interleaved version of a(x). These sequences $af_1/g$ and $a^*f_2/g$ are produced by appropriate shift registers.

Interleavers of the following structure are known, in particular from the French patent application of filing number 01 11479. First of all there is chosen, for example, $g(x)=1+x^2+x^3$ and it is remarked that g(x) divides $1+x^7$ and does not divide $1+x^t$ for $1 \leq t \leq 6$. It is said that the period m of g(x) is 7. The information sequence a(x) is then written $$a(x) = \sum_{k=0}^{m-1} x^k a^{(k)}(x^m) \qquad (3)$$

where $$a^{(k)}(x) = \sum_{j=0}^{r-1} a_{jm+k} x^j$$

is what is referred to as the simplified version of the $k^{th}$ "homogenous component" $a^{(k)}(x^m)$ of a(x); $a^{(k)}(x^m)$ thus describes the contribution to a(x) of the binary elements $a_i$ of $\underline{a}$ such that the residue of i modulo m is equal to k. Next r is factorized into r=R.M with R≧M. With a well-chosen M-tuple $\underline{h}$, each $a^{(k)}(x)$ is interleaved by the wheel interleaver associated with a multiple $d_k\underline{h}$ of $\underline{h}$ and multiplied by $x^{e_k}$ modulo $x^{RM}-1$, to give $a^{*(k)}(x)$. The interleaved sequence $a^*(x)$ is then defined by $$a^*(x) = \sum_{k=0}^{m-1} x^k a^{*(k)}(x^m) \qquad (4)$$

and is divisible by g(x) when a(x) is divisible by g(x). In such a situation, it is said that a(x) enjoys the return-to-zero property or RZ.

In this context, the definition of an interleaver consists of choosing the M-tuple $\underline{h}$ and two m-tuples $\underline{d}=[d_0, \ldots, d_{m-1}]$ and $\underline{e}=[e_0, \ldots, e_{m-1}]$. Methods for selecting these parameters are known.

In an article entitled "*Design of cyclic shift interleavers for Turbo Codes*" published in the Annales des Télécommunications, 56, pages 384 to 393, July–August 2001, J. Yuan et al. use a single wheel interleaver instead of m different interleavers. Furthermore, the single wheel interleaver R×M that they consider is defined by a very particular M-tuple $\underline{h}=[h_0, \ldots, h_{M-1}]$, for which $h_K$ is equal to K.B, B being a well-chosen integer. If the information sequence a(x) is represented by $$a(x) = \sum_{K=0}^{M-1} x^K a^{(K)}(x^M) \quad (5)$$

this choice of h implies that the interleaved version a*(x) of the sequence a(x) is given by $$a^*(x) = \sum_{K=0}^{M-1} x^{K-KMB} a^{(K)}(x^M) \text{ modulo } x^{RM} - 1. \quad (6)$$

However, the article cited above does not provide a systematic tool for building an efficient turbocode interleaver using one wheel interleaver only, and not m different wheel interleavers.

Another interleaver is known, as defined below.

Consider first the 23-tuple b=[0 2 10 4 20 8 17 . . . ] which is obtained as follows. If it is written in the form b=[$b_0$ $b_1$ $b_2$ $b_3$ . . . ], then for i≧3 and with $b_0$=0, $b_1$=2 and $b_2$=10, each $b_i$ is defined to be the residue modulo 23 of $2b_{i-2}$. A matrix B is then defined of dimensions 47×23 in the following manner. The first row (of index 0) of B is the 23-tuple b, and for i>1, the row of index i is obtained by addition of 23 to all the elements of the row of index i−1.

Let now h be the 23-tuple [0 46 44 40 32 . . . ] where for i=0, 1, . . . , h(i) is obtained from h(i−1) by subtraction of $2^{i-1}$ modulo 47. The matrix B* is then constructed by application of this 23-tuple h to B as described above.

Finally the matrix U is defined as the matrix of dimensions 47×23 having 23i+j as entry (i,j), 0≦i≦46, 0≦j≦22. The interleaver is described by the pair (U,B*) by the same correspondence as earlier: this interleaver moves the symbol of initial position 23i+j to the position given by the entry (i,j) of B*.

However, this interleaver, like that described in the article of J. Yuan et al., is not however produced by a systematic tool for building an efficient turbocode interleaver using one wheel interleaver only, and not m different wheel interleavers.

The object of the present invention is to remedy these drawbacks, by providing a systematic method of building an interleaver based on one wheel interleaver only.

To describe the return-to-zero property for an arbitrary interleaver, let g(x) be the feedback polynomial, assumed to be identical, as indicated above, for the two systematic encoders represented in FIG. 1. Let m be its period. It is assumed here that $g(x)=1+x^2+x^3$, which implies that m is equal to 7. The generalization to an arbitrary polynomial g(x) and period m is easy and is not described here.

Let $$a(x) = \sum_{k=0}^{n-1} a_k x^k, a_k \in \{0,1\}$$

be the representation of the information as a binary sequence and let $$a^*(x) = \sum_{k=0}^{n-1} a_k x^{k*}$$

be the interleaved version. It is highly advantageous for a(x) and a*(x) to be both divisible by g(x). As the class of interleavers described below is composed of interleavers able to transform certain sequences a(x) divisible by g(x) into sequences a*(x) which are no longer divisible by g(x), the simultaneous divisibility of a(x) and a*(x) by g(x) imposes several additional restrictive conditions on what may be the calculation of a(x) from the information u(x). A practical procedure which enables this problem to be solved is now given.

Given the interleaver, we will first of all consider the set of positions k which are congruent with i mod m=7 and that are moved by the interleaver to a position k* which is congruent with j mod 7, 0≦i,j≦6. The set of the corresponding monomials of a(x) can be written as $x^i A_{i,j}(x^7)$ and, after interleaving, it can be represented by $x^i A^*_{i,j}(x^7)$, where the coefficients of $A^*_{i,j}(x)$ are a permutation of the coefficients of $A_{i,j}(x)$. In particular, the numbers of coefficients equal to 1 in $A_{i,j}(x^7)$ and in $A^*_{i,j}(x^7)$ are equal. Thus the residues modulo $x^7+1$ of these two polynomials are equal. They are simultaneously equal to 0 if the number of non-nil coefficients is even, and they are simultaneously equal to 1 of this number is odd. A fortiori, the residues modulo g(x) of $A_{i,j}(x^7)$ and $A^*_{i,j}(x^7)$ will also simultaneously be equal to 0 or 1, given that g(x) is a divisor of $x^7+1$. These notations are now used to write a(x) and a*(x) in the following form:

$$a(x) = \sum_{j=0}^{6} A_{0,j}(x^7) + x\sum_{j=0}^{6} A_{1,j}(x^7) + \ldots + x^6 \sum_{j=0}^{6} A_{6,j}(x^7) \quad (7)$$

$$a^*(x) = \sum_{i=0}^{6} A^*_{i,0}(x^7) + x\sum_{i=0}^{6} A^*_{i,1}(x^7) + \ldots + x^6 \sum_{i=0}^{6} A^*_{i,6}(x^7) \quad (8)$$

When g(x) is irreducible, as is for example $g(x)=1+x^2+x^3$, it is equivalent to saying that a(x) (respectively a*(x)) is divisible by g(x), or to saying that a(α)=0 (respectively a*(α)=0) for some root α of g(x). Knowing that any root of $g(x)=1+x^2+x^3$ satisfies $α^7=1$, one of these roots is such that $A_{i,j}(α^7)=A^*_{i,j}(α^7)=A_{i,j}(1)=A^*_{i,j}(1)$ and this common value, denoted $b_{i,j}$, is either 0 or 1. The condition that a(x) is divisible by g(x) may also be expressed by the equivalent condition that a(α)=0, or more explicitly, by $$\sum_{j=0}^{6} b_{0,j} + α\sum_{j=0}^{6} b_{1,j} + \ldots + α^6 \sum_{j=0}^{6} b_{6,j} = 0 \quad (9)$$

Similarly, the condition that a*(x) is divisible by g(x) may be expressed by the equivalent condition $$\sum_{i=0}^{6} b_{i,0} + α\sum_{i=0}^{6} b_{i,1} + \ldots + α^6 \sum_{i=0}^{6} b_{i,6} = 0 \quad (10)$$

Consider now the matrix B of dimensions 7×7 having $b_{ij}$ as entry (i,j), $0 \leq i,j \leq 6$ and define u=[1 1 1 1 1 1 1]. Equations (9) and (10) may then be put into the form $$[1\alpha \ldots \alpha^6]Bu^T=0 \quad (11)$$

$$[1\alpha \ldots \alpha^6]B^Tu^T=0 \quad (12)$$

where $^T$ designates the transposition. Each of these equations gives a condition on the elements of the Galois field $GF(2^3)$, or equivalently, three conditions on the elements of GF(2). The system of equations (11)–(12) thus defines six coefficients $a_i$ of a(x) as a function of the n−6 remaining freely chosen coefficients. One way to solve this system of equations consists in selecting a set I of six pairs (i, j) and defining $$\overline{A}_{i,j}(x^7)=A_{i,j}(x^7) \text{ for } (i,j) \notin I \quad (13)$$

$$\overline{A}_{i,j}(x^7)=A_{i,j}(x^7)-c_{7r(i,j)}x^{7r(i,j)} \text{ for } (i,j) \in I \quad (14)$$

where $c_{7r(i,j)}x^{7r(i,j)}$ is a monomial of $A_{i,j}(x^7)$. Similarly $\overline{b}_{i,j}=\overline{A}_{i,j}(1), \overline{c}_{i,j}=c_{7r(i,j)}$ is defined for $(i,j) \notin I$ and $\overline{c}_{i,j}=0$ for $(i,j) \in I$.

Finally, the matrix $\overline{B}$ (respectively $\overline{C}$) of dimensions 7×7 is defined as the matrix having $\overline{b}_{i,j}$ (respectively $\overline{c}_{i,j}$) in position (i,j), $0 \leq i,j \leq 6$.

Equations (11) and (12) become $$[1\alpha \ldots \alpha^6]\overline{C}u^T=[1\alpha \ldots \alpha^6]\overline{B}u^T \quad (15)$$

$$[1\alpha \ldots \alpha^6]\overline{C}^Tu^T=[1\alpha \ldots \alpha^6]\overline{B}^Tu^T \quad (16)$$

The only remaining problem is to find a set I for which the equations (15) and (16) may be solved to find the corresponding $\overline{c}_{i,j}$. A good solution consists in choosing a set I of the form I={(1,π(1)),(2,π(2)), . . . ,(6,π(6))} where π is a permutation of {1, . . . , 6} and writing $c_i$ instead of $c_{7r(ij)}$ for $(i,j) \in I$. The equations (15) and (16) may then be written $$c_1\alpha+c_2\alpha^2+ \ldots +c_6\alpha^6=\delta \quad (17)$$

$$c_1\alpha^{\pi(1)}+c_2\alpha^{\pi(2)}+ \ldots +c_6\alpha^{\pi(6)}=\epsilon \quad (18)$$

where $\delta=d_2\alpha^2+d_1\alpha+d_0$ and $\epsilon=e_2\alpha^2+e_1\alpha+e_0$ denote the right hand side of equations (15) and (16). Note also $\alpha^i=\alpha^2 f_2(i)+\alpha f_1(i)+f^0(i)$ where the $f_s(i)$ are binary symbols. The equation (15) may now be written $Fc^T=d^T$, with $$F = \begin{vmatrix} 0 & 1 & 1 & 1 & 0 & 1 \\ 1 & 0 & 0 & 1 & 1 & 1 \\ 0 & 0 & 1 & 1 & 1 & 0 \end{vmatrix},$$

$c=[c_1 c_2 \ldots c_6]$ and $d=[d_2 d_1 d_0]$. Finally it is chosen to have π(i)=7−i. Equation (16) may then be written $F^\pi c^T=e^T$ with $e=[e_2 e_1 e_0]$ and the system (15)–(16) is equivalent to $$\begin{vmatrix} 0 & 1 & 1 & 1 & 0 & 1 \\ 1 & 0 & 0 & 1 & 1 & 1 \\ 0 & 0 & 1 & 1 & 1 & 0 \\ 1 & 0 & 1 & 1 & 1 & 0 \\ 1 & 1 & 1 & 0 & 0 & 1 \\ 0 & 1 & 1 & 1 & 0 & 0 \end{vmatrix} c^T = [d \ e]^T$$

where the matrix on the right hand side is non-singular, which makes it possible to calculate the coefficients $c_i$.

A similar method applies in the more general case where the feedback polynomial g*(x) of the second encoder is not identical, but equivalent to g(x), i.e. of the same period as g(x).

With the same object as mentioned above, the present invention provides a method of interleaving a binary sequence a represented by a polynomial $$a(x) = \sum_{i=0}^{n-1} a_i x^i,$$

n being the product of two integers R and M such that $R \geq M$, i being an integer which may be written i=r.M+c, r being a non-negative integer and c being an integer in the interval [0, M−1], this method being remarkable in that it consists in obtaining, from the sequence a, an interleaved binary sequence a* represented by a polynomial $$a^*(x) = \sum_{i=0}^{n-1} a_i x^{i^*}$$

where i*=[r−h(c)].M+c mod n, the numbers h(c) being obtained by:

the choice of an M-tuple $\underline{h}_0=[h_0(0), \ldots, h_0(M-1)]$ of non-negative integers less than R−1 such that, given a predetermined set Π of circulating matrices P of dimensions M×M, for any matrix P of Π, the residues modulo R of the components of the vector $\underline{h}_0.P$ are not nil; and the corresponding choice of an M-tuple $\underline{h}=[h(0), \ldots, h(M-1)]$ obtained from the M-tuple $\underline{h}_0$ by the application of a permutation moving the element $h_0(c)$ to position L×c mod M, L being an integer relatively prime with M.

It will be recalled that a square matrix is said to be circulating when each of its columns, from the second one, is derived from the previous one by a circular permutation of amplitude 1.

The interleaving method according to the present invention has a relatively homogeneous action on the residues modulo L of the indices i of the symbols of the sequence a(x). Indeed let T(d,d*) be the set of the indices i which are congruent with d modulo L and which are such that the corresponding index i* is congruent with d* modulus L. The method according to the invention has the advantage of inducing sets T(d,d*) whose sizes are close to each other.

In a particular embodiment, the set Π contains circulating matrices $P_1$ and $P_2$ such that:

the first column of $P_1$ is $[1-2 \ 1 \ 0 \ \ldots \ 0]^T$ and
the first column of $P_2$ is $[2-2 \ 0 \ 0 \ \ldots \ 0]^T$, where $^T$ designates the transposition.

In another particular embodiment, the set Π contains circulating matrices $P_3$ to $P_8$ such that:

the first column of $P_3$ is $[1-1-1 \ 1 \ 0 \ \ldots \ 0]^T$,
the first column of $P_4$ is $[1-1 \ 1-1 \ 0 \ \ldots \ 0]^T$,
the first column of $P_5$ is $[1 \ 0-2 \ 1 \ 0 \ \ldots \ 0]^T$,
the first column of $P_6$ is $[1-2 \ 0 \ 1 \ 0 \ \ldots \ 0]^T$,
the first column of $P_7$ is $[2-1-1 \ 0 \ 0 \ \ldots \ 0]^T$ and
the first column of $P_8$ is $[1 \ 1-2 \ 0 \ 0 \ \ldots \ 0]^T$.

In another particular embodiment, the set Π contains circulating matrices $P_9$ to $P_{20}$ such that:

the first column of $P_9$ is $[1\ 1\text{-}1\text{-}1\ 0\ \ldots\ 0]^T$,
the first column of $P_{10}$ is $[1\text{-}1\ 0\ 1\text{-}1\ 0\ \ldots\ 0]^T$,
the first column of $P_{11}$ is $[1\text{-}1\ 0\text{-}1\ 1\ 0\ \ldots\ 0]^T$,
the first column of $P_{12}$ is $[1\ 0\text{-}1\text{-}1\ 1\ 0\ \ldots\ 0]^T$,
the first column of $P_{13}$ is $[1\text{-}1\text{-}1\ 0\ 1\ 0\ \ldots\ 0]^T$,
the first column of $P_{14}$ is $[1\ 0\text{-}1\ 1\text{-}1\ 0\ \ldots\ 0]^T$,
the first column of $P_{15}$ is $[1\text{-}1\ 1\ 0\text{-}1\ 0\ \ldots\ 0]^T$,
the first column of $P_{16}$ is $[1\ 0\text{-}2\ 0\ 1\ 0\ \ldots\ 0]^T$,
the first column of $P_{17}$ is $[1\ 0\ 0\text{-}2\ 1\ 0\ \ldots\ 0]^T$,
the first column of $P_{18}$ is $[1\text{-}2\ 0\ 0\ 1\ 0\ \ldots\ 0]^T$,
the first column of $P_{19}$ is $[1\ 0\ 1\text{-}2\ 0\ 0\ \ldots\ 0]^T$ and
the first column of $P_{20}$ is $[2\text{-}1\ 0\ 1\ 0\ 0\ \ldots\ 0]^T$.

In another particular embodiment, the set Π contains circulating matrices $P_{21}$ to $P_{24}$ such that:
the first column of $P_{21}$ is $[1\text{-}3\ 2\ 0\ 0\ \ldots\ 0]^T$,
the first column of $P_{22}$ is $[2\text{-}3\ 1\ 0\ 0\ \ldots\ 0]^T$,
the first column of $P_{23}$ is $[1\text{-}2\ 2\text{-}1\ 0\ \ldots\ 0]^T$ and
the first column of $P_{24}$ is $[3\text{-}3\ 0\ 0\ 0\ \ldots\ 0]^T$.

In another particular embodiment, the set Π contains circulating matrices $P_1$ to $P_8$ defined previously.

In another particular embodiment, the set Π contains circulating matrices $P_1$ to $P_{20}$ defined previously.

In another particular embodiment, the set Π contains circulating matrices $P_1$ to $P_{24}$ defined previously.

In another particular embodiment, the set Π contains circulating matrices $P_1$, $P_2$ and $P_{21}$ to $P_{24}$ defined previously.

In another particular embodiment, the set Π contains circulating matrices $P_1$ to $P_8$ and $P_{21}$ to $P_{24}$ defined previously.

Conditions that are more or less strict are thus defined so that, if it is possible to satisfy them, the action on the residues modulo L of the indices i of the symbols of the sequence a(x) will not only be relatively homogeneous, but will furthermore result in a more or less pronounced improvement in the full span of the sequences of low weight (a reminder is given further on of the definition of full span).

With the same object as that indicated above, the present invention provides an encoding method for the transmission of information, remarkable in that it implements an interleaving method as succinctly described above, and in that:

the integer L mentioned above is the period which is common to a first and a second predetermined polynomials with binary coefficients g(x) and g*(x) of degree d and of constant term equal to 1;

the information is presented in the form of binary sequences u of length l=n−2d, where n is a predetermined multiple of L;

for each of the sequences u, a triplet v is produced of binary sequences (a,b,c) intended to be transmitted and obtained as follows:

the sequence b is represented by the polynomial b(x)=a(x).f$_1$(x)/g(x), where f$_1$(x) is a second predetermined polynomial with binary coefficients, not having a common divisor with g(x), the sequence c is represented by the polynomial c(x)=a*(x).f$_2$(x)/g*(x), where f$_2$(x) is a third predetermined polynomial with binary coefficients, not having a common divisor with g*(x), and where a*(x) is a polynomial associated with a sequence a* produced by interleaving of the sequence a, and the sequence a is of length n and obtained by inserting 2d padding bits in the sequence u in order that the polynomial $$a(x) = \sum_{i=0}^{n-1} a_i x^i$$

associated with a be divisible by g(x) and that the polynomial a*(x) be divisible by g*(x).

In a particular embodiment, the first and second polynomials g(x) and g*(x) are identical.

Still with the same object, the present invention also provides a method of decoding, remarkable in that it enables the decoding of sequences received which were transmitted after having been encoded by means of an encoding method as above.

Still with the same object, the present invention also provides a device for encoding sequences of data intended to be transmitted, these sequences being encoded by means of an encoding method as above, this device being remarkable in that it comprises:

means for obtaining, for each sequence of data u, the sequence a associated with u by inserting the 2d padding bits mentioned above in the sequence u, and at least one encoder comprising an interleaver capable of performing the permutation provided for in the above-mentioned interleaving method.

Still with the same object, the present invention further provides a decoding device intended to implement a decoding method as above, remarkable in that it comprises:

at least one decoder comprising two interleavers capable of performing the permutation provided for in the above-mentioned interleaving method, and a deinterleaver capable of reversing that permutation, and a unit adapted to produce a binary sequence û by removing 2d bits from the estimated sequence a obtained at the issue of the decoding of sequences a', b' and c' received corresponding respectively to the transmitted sequences a, b and c, the 2d bits to be removed corresponding to the 2d bits inserted in the sequence u to obtain the sequence a.

The present invention also relates to:

an apparatus for transmitting encoded digital signals, comprising an encoding device as above and comprising a unit adapted to transmit the encoded sequences a, b, and c;

an apparatus for receiving encoded digital signals, comprising a decoding device as above and comprising a unit adapted to receive the sequences a', b' and c';

a telecommunications network, comprising at least one transmission apparatus or one reception apparatus as above;

a base station in a telecommunications network, comprising at least one transmission apparatus or one reception apparatus as above;

a mobile station in a telecommunications network, comprising at least one transmission apparatus or one reception apparatus as above;

an information storage medium which can be read by a computer or a microprocessor storing instructions of a computer program, making it possible to implement an interleaving method and/or an encoding method and/or a decoding method as above;

a partially or entirely removable information storage medium, which can be read by a computer or a microprocessor storing instructions of a computer program, making it possible to implement an interleaving method and/or an encoding method and/or a decoding method as above;

a computer program product comprising sequences of instructions to implement an interleaving method and/or an encoding method and/or a decoding method as above.

As the particular features and advantages of the encoding method and device, of the decoding method and device, of the apparatuses for transmitting and receiving digital signals, of the telecommunications network, of the base station, of the mobile station, of the different storage means and of the computer program product are similar to those of the interleaving method according to the invention, they are not repeated here.

Other aspects and advantages of the invention will emerge from a reading of the following detailed description of a particular embodiment, given by way of non-limiting example. The description refers to the accompanying drawings, in which:

FIG. 1, already described, is a diagram of a conventional turboencoder of throughput 1/3;

Let $$a(x) = \sum_{i=0}^{n-1} a_i x^i$$

be a polynomial representing a binary sequence $\underline{a}$. Sometimes $a(x)$ is referred to as an information sequence, but this is a misnomer. In all that follows, the prior art wheel interleavers mentioned earlier are called "multiwheel" interleavers, since they use an elementary wheel interleaver for each homogeneous component of the information sequence $a(x)$. By contrast, the wheel interleavers according to the present invention are called "monowheel" interleavers since they use one wheel interleaver only.

Let $$a^*(x) = \sum_{i=0}^{n-1} a_i x^{i^*}$$

be the polynomial representing the sequence $\underline{a}^*$ obtained after interleaving of $a(x)$. It is assumed that n is the product of two integers R and M such that $R \geq M$. Let $\underline{h}=[h(0), \ldots, h(M-1)]$ be an M-tuple of non-negative integers less than R−1.

Any $i \in [0, n-1]$ is written in the form $i=rM+c$, where $c \in [0, M-1]$. If the permutation $\pi: i \to i^*=\pi(i)$ can be defined by $i^*=[r-h(c)]M+c \mod n$, the corresponding interleaver is called a monowheel interleaver. The turbocode associated with this interleaver is the set of all the triplets $$v(x)=[a(x)a(x)f_1(x)/g(x)a^*(x)f_2(x)/g(x)]$$

that correspond to polynomials $a(x)$ such that $a(x)$ and $a^*(x)$ are both divisible by a polynomial $g(x)$ of degree t.

As explained above, this pair of constraints may, for the majority of interleavers, be satisfied if 2t bits are judiciously selected among the n bits of $a(x)$ to calculate them as a function of the n−2t remaining bits, which are the true information bits. In what follows, it is assumed that $g(x)=1+x^2+x^3$, $f_1(x)=1+x+x^3$ and that $f_2(x)=1+x+x^2+x^3$. We thus have t=3.

The generalization to other polynomials $g(x)$ is easy and is not described here. Similarly, the generalization to the case in which $a^*(x)$ must be divisible, not by $g(x)$, but by an equivalent polynomial $g^*(x)$ (i.e. of the same period) is easy and is not described here.

If $a(x)$ and $a^*(x)$ are both divisible by $g(x)$, $a(x)$ is a so-called TTC ("To be Taken into Consideration") sequence. The present invention seeks to optimize the choice of $\underline{h}$ to make the corresponding interleaver as efficient as possible at the time of the processing of TTC sequences. According to the invention, the choice of $\underline{h}$ is such that for the polynomials $a(x)$ that are TTC and have a binary weight or Hamming weight (that is to say the number of non-nil coefficients) equal to 2, 3, or 4, the weight of $v(x)$ is relatively high.

As a general hypothesis it is taken that M is not divisible by 7 and that $c \neq d$ implies $h(c) \neq h(d) \mod R$.

Figure 2:
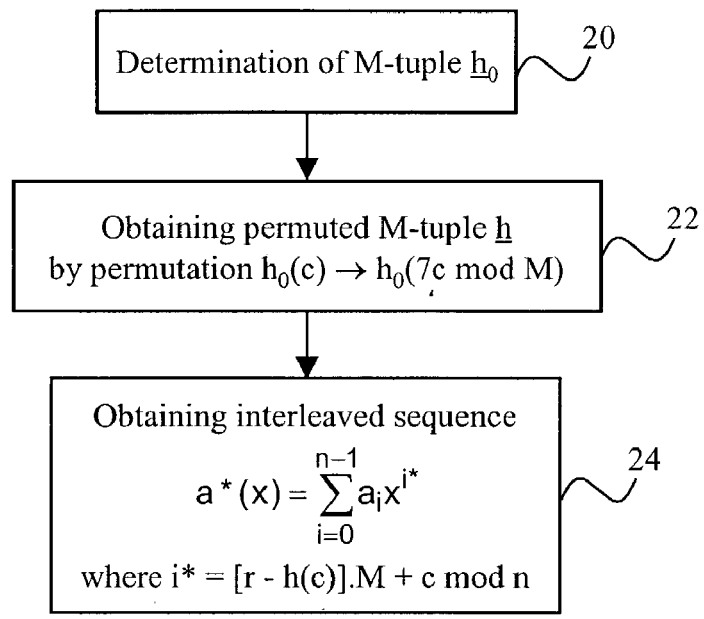
FIG. 2 is a flow diagram illustrating the main steps of an interleaving method according to the present invention, in a particular embodiment.

As FIG. 2 shows, the interleaving method according to the present invention first of all consists, at a step 20, in determining an M-tuple $\underline{h}_0=[h_0(0), \ldots, h_0(M-1)]$ of non-negative integers less than R−1 such that, given a predetermined set Π of circulating matrices P of dimensions M×M, for any matrix P of Π, the residues modulo R of the components of the vector $\underline{h}_0.P$ are not nil.

The M-tuple $\underline{h}_0$ may be determined by imposing two conditions, i.e. by choosing a set Π containing the circulating matrices $P_1$ and $P_2$ defined in the introduction.

As a variant, more conditions may be imposed. In one of these variants, the set Π contains the circulating matrices $P_3$ to $P_8$ defined in the introduction. In another variant, the set Π contains the matrices $P_9$ to $P_{20}$ defined in the introduction. In another variant, the set Π contains the matrices $P_{21}$ to $P_{24}$ defined in the introduction.

In other variants, the M-tuple $\underline{h}_0$ may be determined by proceeding with successive selections. Thus, in another variant, the set Π contains both the matrices $P_1$, $P_2$ and the matrices $P_3$ to $P_8$, that is to say that among the M-tuples of non-negative integers less than R−1 such that the residues modulo R of the components of the vectors $\underline{h}_0.P_1$ and $\underline{h}_0.P_2$ are not nil, only those are kept which are in addition such that the residues modulo R of the components of the vectors $\underline{h}_0.P_3$ to $\underline{h}_0.P_8$ are not nil. Similarly:

in another variant, the set Π contains both the matrices $P_1$ to $P_8$ and the matrices $P_9$ to $P_{20}$, in another variant, the set Π contains both the matrices $P_1$ to $P_{20}$ and the matrices $P_{21}$ to $P_{24}$, in another variant, the set Π contains both the matrices $P_1$, $P_2$ and the matrices $P_{21}$ to $P_{24}$, in another variant, the set Π contains both the matrices $P_1$ to $P_8$ and the matrices $P_{21}$ to $P_{24}$.

Next, as FIG. 2 shows, at a step 22, the components of the M-tuple $\underline{h}_0=[h_0(0), \ldots, h_0(M-1)]$ are permuted to obtain an M-tuple $\underline{h}=[h(0), \ldots, h(M-1)]$ whose components are defined by $h(L \times c \bmod M) = h_0(c)$, where L is an integer relatively prime with M. In all that follows, the particular example is described where L=7 is the period of a polynomial g(x) in the non-limiting application of the invention to turbocodes.

Finally, at a step 24, there is obtained, from the sequence $\underline{a}$, an interleaved binary sequence $\underline{a}^*$ represented by a polynomial $$a^*(x) = \sum_{i=0}^{n-1} a_i x^{i^*}$$

where $i^*=[r-h(c)].M+c \bmod n$.

Consider first of all the sequences a(x) of weight equal to 2.

Let $a(x)=x^i+x^j$ and $a^*(x)=x^{i^*}+x^{j^*}$ with $i=rM+c, j=sM+d,$ (19)

$i^*=[r-h(c)]M+c, j^*=[s-h(d)]M+d.$ (20)

For a TTC sequence a(x) of weight 2, the full span $fsp(a(x))$ is defined by $|j-i|+|j^*-i^*|$. The conditions which make a(x) a TTC sequence are $i \equiv j \bmod 7, i^* \equiv j^* \bmod 7,$ (21)

which means $(r-s)M+(c-d) \equiv 0 \bmod 7,$ (22)

$(r-s)M+(c-d) \equiv [h(c)-h(d)]M \bmod 7.$ (23)

As M has been assumed to be relatively prime with 7, these two conditions can only be satisfied simultaneously if $h(c)-h(d) \equiv 0 \bmod 7.$ (24)

Assuming that condition (24) is satisfied, the minimum value of fsp(a) may now be determined. From the equations (19) and (20) we obtain $fsp(a)=|(r-s)M+(c-d)|+|(r-s)M+(c-d)-[h(c)-h(d)]M|$ If c=d, then the fact that M is relatively prime with 7 implies, using equation (22), that $|r-s|=7t$ with $t \geq 1$, which gives $fsp(a) \geq 7M$. If $c \neq d$, fsp(a) has the form $|F|+|F-[h(c)-h(d)]M|$ where F denotes the left hand side of equation (22) and where $|h(c)-h(d)|=7t$ for $t \geq 1$. Once again we have $fsp(a) \geq 7M$.

By way of non-limiting example, for R=35 and M=11, if all the components h(i) of h are different, the full span of the TTC sequences of weight 2 is greater than 7×11=77. As a result, the minimum weight of the corresponding encoded sequences v(x) is greater than 50.

Consider now the sequences a(x) of weight equal to 4. Let $a(x)=x^i+x^j+x^k+x^l$ and $a^*(x)=x^{i^*}+x^{j^*}+x^{k^*}+x^{l^*}$ with $i=rM+c, j=sM+d, k=tM+e, l=uM+f,$ (25)

$i^*=[r-h(c)]M+c, j^*=[s-h(d)]M+d,$ $k^*=[t-h(e)]M+e, l^*=[u-h(f)]M+f$ (26)

Only considered here are some of the cases in which a(x) is a TTC sequence. These cases are characterized as follows. Assuming that i<j<k<l, the residues modulo 7 of i and j are equal, as are the residues modulo 7 of k and of l. Moreover, it is assumed that the four integers i*, j*, k* and l* are such that the two smallest of them have the same residue modulo 7 and that the two largest of them also have the same residue modulo 7.

For a TTC sequence a(x) of weight 4, the full span fsp(a(x)) is defined by $f+f^*$ with $f=(j-i)+(l-k)$ and $f^*=f_1^*+f_2^*$ where $f_1^*$ (and respectively $f_2^*$) is the absolute value of the difference between the two smallest (and respectively the two largest) integers of the set $\{i^*, j^*, k^*, l^*\}$. Under these conditions, which make a(x) a TTC sequence, it is advantageous for i "close" to j and for k "close" to l, to have the numbers $f_1^*$ and $f_2^*$ sufficiently large to make fsp(a(x)) sufficiently high.

There are 24 possible manners of sequencing the four integers i*, j*, k* and l*.

The situations which it is sought to avoid are those where j=i+7 and l=k+7 and in which any one of the eight following situations occurs after interleaving:

1. $k^*=i^*+7$ and $l^*=j^*+7$
2. $k^*=i^*+7$ and $l^*=j^*-7$
3. $k^*=i^*-7$ and $l^*=j^*+7$
4. $k^*=i^*-7$ and $l^*=j^*-7$
5. $l^*=i^*+7$ and $k^*=j^*+7$
6. $l^*=i^*+7$ and $k^*=j^*-7$
7. $l^*=i^*-7$ and $k^*=j^*+7$
8. $l^*=i^*-7$ and $k^*=j^*-7$ By way of example three of these eight situations are dealt with below.

Situation 1

Assuming that $k^*=i^*+7$ and $l^*=j^*+7$ we obtain, by (25) and (26), $[t-h(e)]M+e=[r-h(c)]M+c+7$ (27)

$[t-h(e+7)]M+e+7=[r-h(c)]M+c+14$ (28)

Here and in all that follows, e+7 and c+7 are calculated modulo M. This implies $[h(e+7)-h(e)]M-7=[h(c+7)-h(c)]M-7$ (29)

Moreover, the fact that M is assumed to be relatively prime with 7 implies, on the basis of (27) or (28), that $e \equiv c+7 \bmod M$. Then, from equation (29) we obtain:

$h(c+14)-2h(c+7)+h(c) \equiv 0 \bmod R$ (30)

This constitutes a necessary condition for having the equalities expressed at point 1 above.

Situation 2

Assuming that $k^*=j^*-7$ and $l^*=i^*+7$ we obtain $[t-h(e+7)]M+e+7=[r-h(c)]M+c-7$ (31)

$[t-h(e)]M+e=[r-h(c+7)]M+c$ (32)

which implies (29) and $2[h(c+7)-h(c)] \equiv 0 \bmod R$ (33)

This constitutes a necessary condition to have the equalities expressed at point 6 above.

Situation 3

Assuming that $k^*=i^*+7$ and $l^*=j^*-7$ we obtain $[t-h(e)]M+e=[r-h(c)]M+c+7$ (34)

$[t-h(e+7)]M+e+7=[r-h(c+7)]M+c$ (35)

which implies $e \equiv c+7 \bmod M$ using equation (34) and $e \equiv c-7 \bmod M$ using equation (35). Knowing that M is assumed to be relatively prime with 7, the two conditions are incompatible and obtaining the equalities expressed at point 2 above is impossible when j=i+7 and l=k+7.

The other points may be dealt with in a similar manner. They do not generate necessary conditions other than (30) and (33).

To summarize, we have obtained two conditions such that at least one of them is satisfied if the full span of a TTC sequence a(x) of weight 4 is equal to 28. To be sure that this full span is equal to at least 35, it is appropriate to choose the elements h(i) of $\underline{h}$ (which is supposed to satisfy the conditions particular to the sequences a(x) of weight 2) such that, when the indices i of h(i) are calculated modulo M, these h(i) satisfy neither condition (30), nor condition (33). Similar conditions may be imposed to guarantee that this full span is equal to or greater than any multiple of 7 chosen beforehand. They have been set out above in terms of matrices $P_i$. It is however not guaranteed that they will be achievable if the values of R and M are not sufficiently high.

Consider now the sequences a(x) of weight equal to 3. Let $a(x)=x^i+x^j+x^k$ et $a^*(x)=x^{i^*}+x^{j^*}+x^{k^*}$ with $$i=rM+c,\ j=sM+d,\ k=tM+e,$$

$$i^*=[r-h(c)]M+c, \quad (36)$$

$$j^*=[s-h(d)]M+d,$$

$$k^*=[t-h(e)]M+e \quad (37)$$

For a TTC sequence a(x) of weight 3, the full span fsp(a(x)) of a(x), is defined by $\max\{i,j,k\}-\min\{i,j,k\}+\max\{i^*,j^*,k^*\}-\min\{i^*,j^*,k^*\}$. The weight of the encoded sequence v(x) corresponding to an information sequence a(x) of weight 3 strongly depends on the full span of a(x) associated with the permutation $a(x)\to a^*(x)$. In the case of monowheel interleavers, a very simple solution exists to maximize the minimum full span of weight 3 sequences. In this case, the full span fsp(a(x)) is $$fsp(a(x))=k-i+\max(i^*,j^*,k^*)-\min(i^*,j^*,k^*) \quad (38)$$

To guarantee a good full span for any sequence a(x) of weight 3, it is chosen to apply conditions to the three quantities $|j-i|+|j^*-i^*|$, $|j-k|+|j^*-k^*|$ and $|k-i|+|k^*-i^*|$. Naturally, the value of fsp(a(x)) will be greater than any of these quantities. Consider for example $$j-i=(s-r)M+(d-c), \quad (39)$$

$$j^*-i^*=(s-r)M+(d-c)-M(h(d)-h(c)) \quad (40)$$

It is observed that $|(j-i)-(j^*-i^*)|=M\ |h(d)-h(c)|$. This implies that $|j-i|+|j^*-i^*|\geq M\ |h(d)|h(c)|$. Thus, if the elements of the M-tuple $\underline{h}$ are chosen in a set of integers relatively prime with R and such that, for any pair (c,d) of that set, $|h(d)-h(c)|\geq u$ with $u\geq 0$, the full span of any sequence a(x) of weight 3 will be greater than Mu.

How to apply the rules and observations made earlier is illustrated below by means of an example.

It is chosen to have R=35 and M=11. Next, to satisfy the conditions described earlier, it is assumed that the possible values of the integers h(i) are restricted to the subset {3,6,9,12,16,19,22,26,29,32} of non-negative integers less than 34. Next, a known selection rule is applied, described in the document FR-A-2 805 103, to find, in the set of all the 11-tuples with $h_0(0)=0$ and $h_0(i)$ belonging to the above subset for $1\leq i\leq 10$, an 11-tuple $\underline{h}_0$ which satisfies properties A1, A2, A3 and A4 defined as follows:

Property A1: assume that $R\geq M\geq 2$. Any sequence z(x) of weight equal to 2 and interleaved by a wheel interleaver of size R×M specified by an M-tuple $\underline{h}_0$ will satisfy $fsp(z)\geq 2$ when all the residues modulo R of the components of $\underline{h}_0$ are different.

Property A2: assume that $R\geq M\geq 6$. Let $P_1$ be the circulating matrix of dimensions M×M of which the first column is $[1\text{-}2\ 1\ 0\ \ldots\ 0]^T$ and let $P_2$ be the circulating matrix of dimensions M×M of which the first column is $[2\text{-}2\ 0\ \ldots\ 0]^T$. Any sequence z(x) of weight equal to 4 interleaved by a wheel interleaver of size R×M specified by an M-uplet $\underline{h}_0$ will satisfy $fsp(z)\geq 6$ if $\underline{h}_0$ satisfies property A1 and if the residues modulo R of the components of $\underline{h}_0 P_1$ and of $\underline{h}_0 P_2$ are not nil.

Property A3: assume that $R\geq M\geq 8$. Now consider the circulating matrices $P_i$, i=3, ..., 8 of dimensions M×M of which the first columns are respectively:

$[1\text{-}1\text{-}1\ 1\ 0\ \ldots\ 0]^T$ for $P_3$,
$[1\text{-}1\ 1\text{-}1\ 0\ \ldots\ 0]^T$ for $P_4$,
$[1\ 0\text{-}2\ 1\ 0\ \ldots\ 0]^T$ for $P_5$,
$[1\text{-}2\ 0\ 1\ 0\ \ldots\ 0]^T$ for $P_6$,
$[2\text{-}1\text{-}1\ 0\ \ldots\ 0]^T$ for $P_7$,
$[1\ 1\text{-}2\ 0\ \ldots\ 0]^T$ for $P_8$.

Any sequence z(x) of weight equal to 4 interleaved by a wheel interleaver of size R×M specified by an M-uplet $\underline{h}_0$ will satisfy $fsp(z)\geq 8$ if $\underline{h}_0$ satisfies the properties A1 and A2 and if, for any i, i=3, ..., 8, the residues modulo R of the components of $\underline{h}_0 P_i$ are not nil.

Property A4: assume that $R\geq M\geq 8$. Consider the four circulating matrices $P_i$, i=21, ..., 24 of dimensions M×M of which the first columns are respectively:

$[1\text{-}3\ 2\ 0\ \ldots\ 0]^T$ for $P_{21}$,
$[2\text{-}3\ 1\ 0\ \ldots\ 0]^T$ for $P_{22}$,
$[1\text{-}2\ 2\text{-}1\ 0\ \ldots\ 0]^T$ for $P_{23}$,
$[3\text{-}3\ 0\ \ldots\ 0]^T$ for $P_{24}$.

Any sequence z(x) of weight equal to 6 interleaved by a wheel interleaver of size R×M specified by an M-tuple $\underline{h}_0$ will satisfy $fsp(z)\geq 8$ if ho satisfies the property A1 and if, for any i, i=9, ..., 12, the residues modulo R of the components of $\underline{h}_0 P_i$ are not nil.

The 11-tuple $$\underline{h}_0=[0, 3, 12, 16, 6, 19, 26, 9, 32, 29, 22] \quad (41)$$

satisfies these properties.

Finally, for i=0, ..., 10, the element $\underline{h}_0(i)$ of $\underline{h}_0$ is moved to position 7i mod 11 to obtain a new 11-tuple h given by $$\underline{h}=[0, 32, 19, 12, 22, 9, 6, 3, 29, 26, 16]$$

Figure 3:
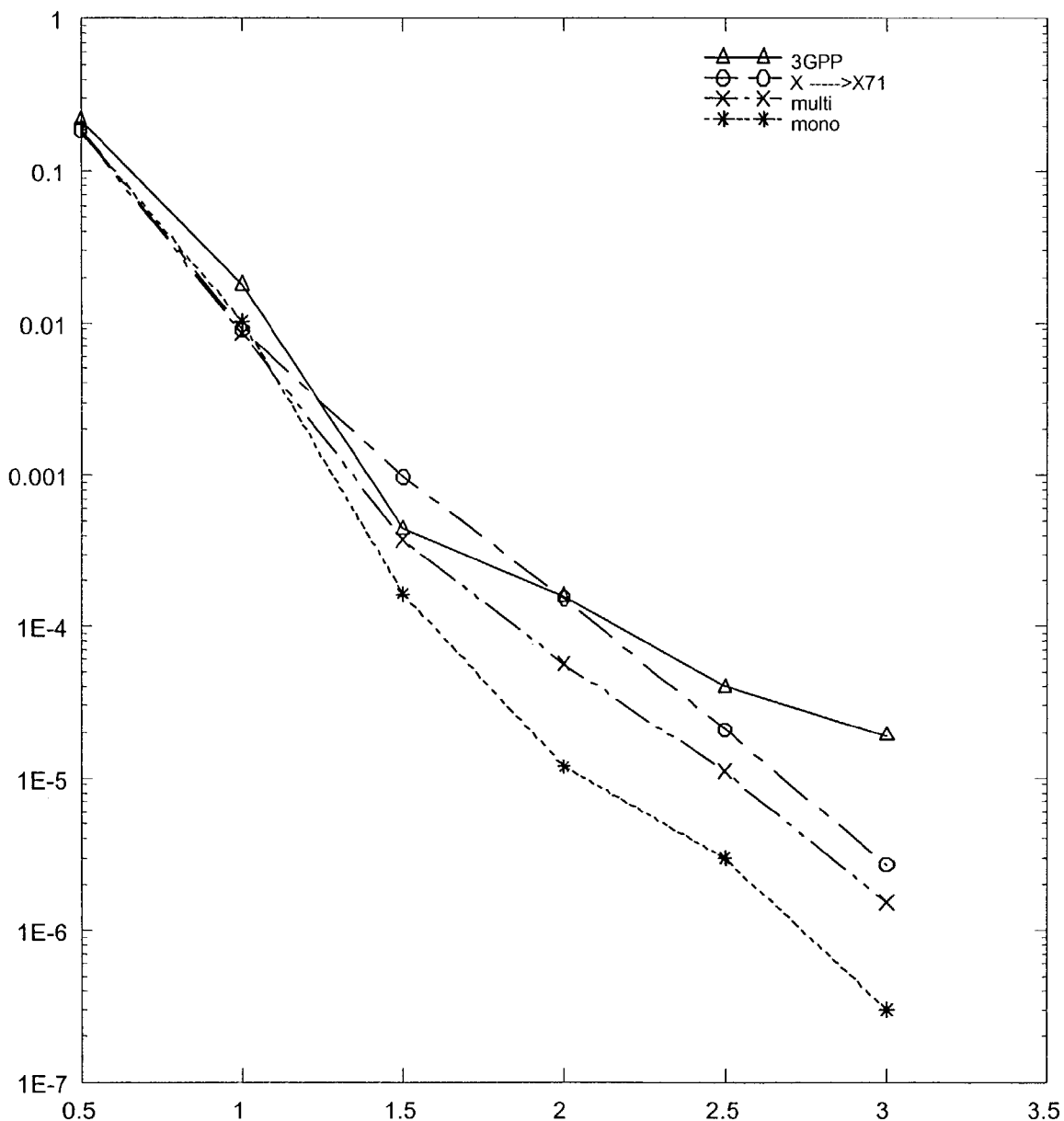
FIG. 3 is a graph comparing the performances of several interleavers.

For the turbocode corresponding to this monowheel interleaver, the length of the information sequences is equal to 35×11=385. This turbocode has been simulated on an AWGN (Additive White Gaussian Noise) channel and compared to three other interleavers of the same size. The frame error rates of these four interleavers are represented in FIG. 3 as a function of the signal to noise ratio. The first of these interleavers, represented by triangles on the graph, is the standard 3GPP interleaver, the second, represented by circles, is an interleaver of type known as "x to $x^e$" with e=71. It may be recalled that an interleaver of type "x to $x^e$" is defined as follows: if $\underline{u}$ designates an input sequence of length n and $\underline{u}^*$ the permuted sequence, the interleaver moves each bit which is initially located in position i in $\underline{u}$, to a position (e.i modulo n) in $\underline{u}^*$. The third interleaver, represented by crosses in the drawing, is a multiwheel interleaver.

It can be observed that the interleaver corresponding to the present invention, represented by stars in the drawing, is the most effective.

Figure 4:
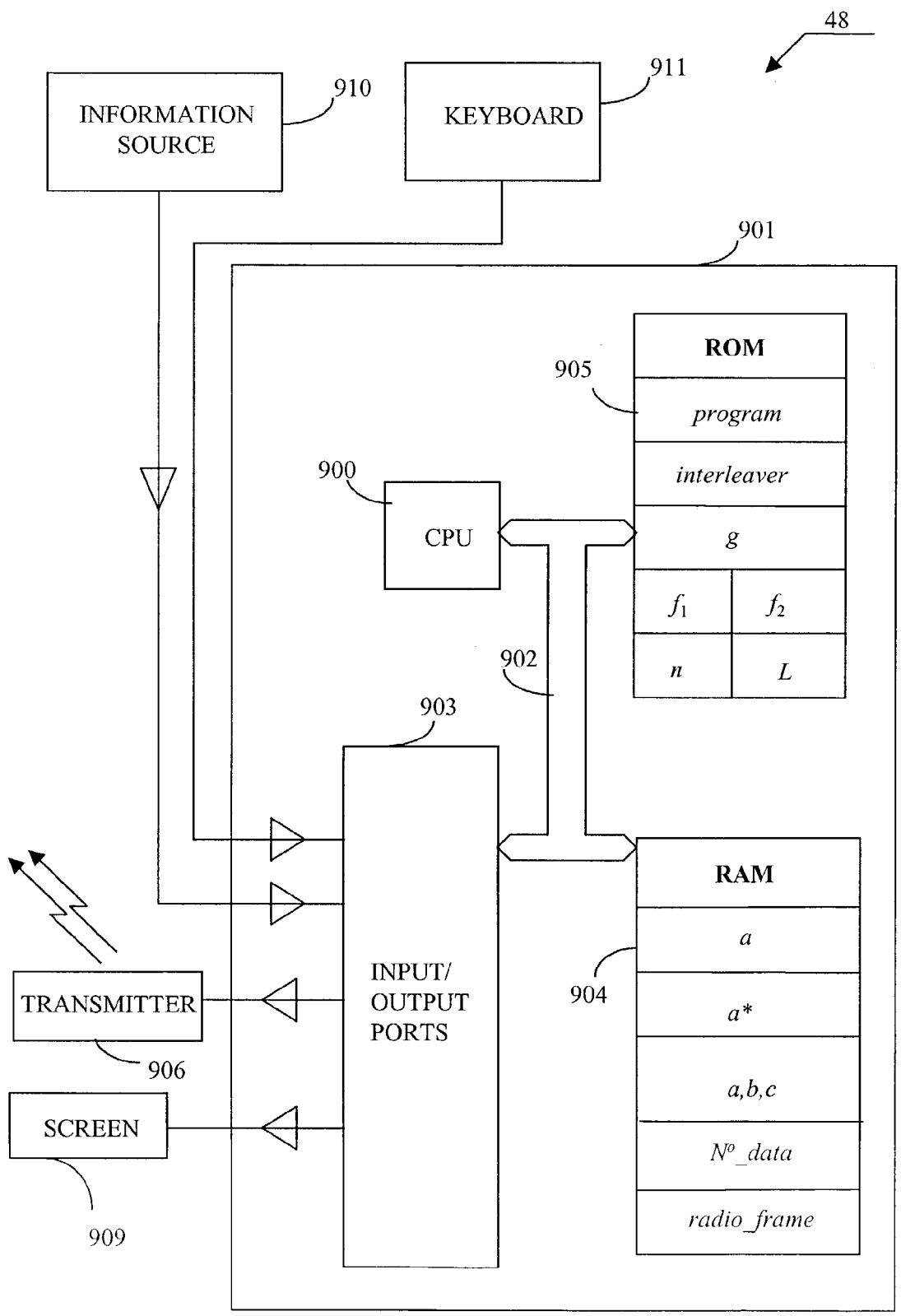
FIG. 4 is a diagram of a digital signal transmission apparatus according to a particular embodiment of the invention.

FIG. 4 shows, very schematically, an apparatus for transmission of digital signals 48 implementing the invention. This device comprises a keyboard 911, a screen 909, a source of external information 910, a radio transmitter 906, conjointly connected to input/output ports 903 of an encoding device 901 which is implemented here in the form of a logic unit.

The encoding device 901 comprises, connected together by an address and data bus 902:
- a central processing unit 900,
- a random access memory RAM 904,
- a read only memory 905, and
- said input/output ports 903.

The central processing unit 900 is adapted to implement the flow diagram illustrated in FIG. 2.

Each of the elements illustrated in FIG. 4 is well known to the person skilled in the art of microcomputers and transmission systems and, more generally, of information processing systems. These known elements are therefore not described here. It should be noted, however, that:
- the information source 910 could, for example, be an interface peripheral, a sensor, a demodulator, an external memory or other information processing system (not shown), and could for example supply sequences of signals representing speech, service messages or multimedia data in particular of the IP or ATM type, in the form of sequences of binary data,
- the radio transmitter 906 is adapted to implement a packet transmission protocol on a wireless channel, and to transmit these packets over such a channel.

The random access memory 904 stores data, variables and intermediate processing results, in memory registers bearing, in the description, the same names as the data whose values they store. It should be noted, in passing, that the word "register" designates, throughout the present description, a memory area of low capacity (a few items of binary data) and equally a memory area of large capacity (making it possible to store a complete program) within a random access memory or read only memory.

The random access memory 904 contains in particular the following registers:
- a register "N⁰_data" in which the length k of the data sequence u is stored,
- a register "a", in which the sequence a obtained by extending the sequence u by means of padding bits is stored,
- a register "a*" in which the interleaved sequence a* is stored,
- a register "a,b,c" in which the sequences a, b and c resulting from the turboencoding are stored, and
- a register "radio_frame" in which the entire radio frame to be transmitted is stored.

The read only memory 905 is adapted to store, in registers which, for convenience, have the same names as the data which they store:
- the operating program of the central processing unit 900, in a register "program",
- the coefficients of the polynomial g(x), in a register "g",
- the coefficients of the polynomial $f_1(x)$, in a register "$f_1$",
- the coefficients of the polynomial $f_2(x)$, in a register "$f_2$",
- the length of the sequences a and a*, in a register "n",
- the permutation defining the interleaver, in a register "interleaves", and
- the value L of the period of g in a register "L".

Figure 1:
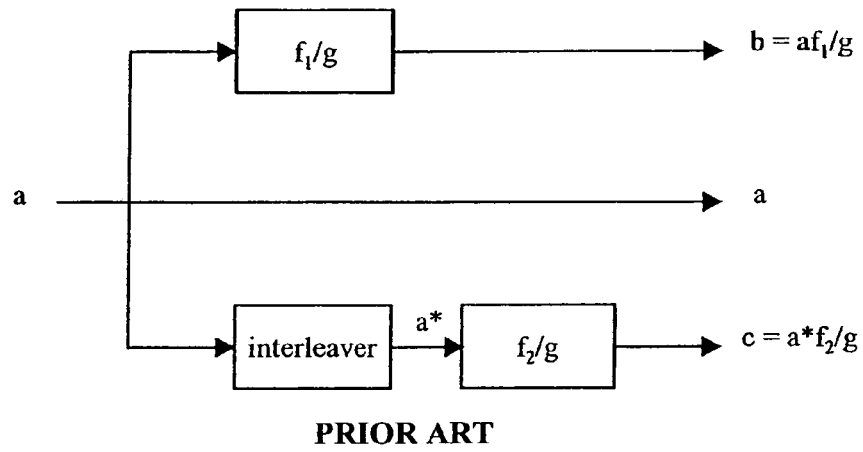
Figure 5:
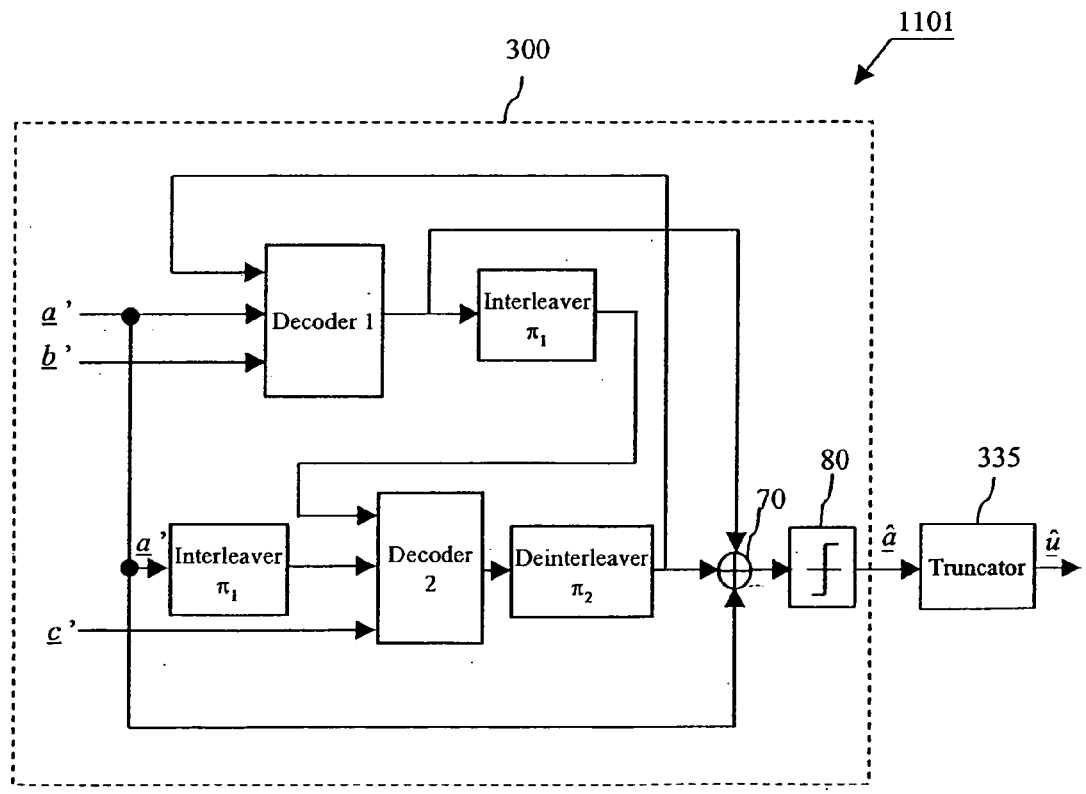
FIG. 5 is a diagram of an embodiment of the invention within a turbodecoding device with two parities.

FIG. 5 represents a decoding device 1101 capable of decoding data supplied by an apparatus such as that of FIG. 4. The decoding after reception is performed by a turboencoder constituted by two decoders, two interleavers $\pi_1$, a deinterleaver $\pi_2$, an adder 70 and a decision unit 80. The decoders, which are designated "Decoder 1" and "Decoder 2" in FIG. 5, are preferably MAP (Maximum A Posteriori Probability) decoders, for example of the BCJR type, that is to say using the Bahl, Cocke, Jelinek and Raviv algorithm; but it will also be possible to use other types of decoder, for example of the SOVA (Soft Output Viterbi Algorithm) type. Preferably also, the decoding takes account of the current value of the signal to noise ratio.

A conventional turbodecoder also requires a looping back of the output of the deinterleaver $\pi_2$ onto the input of the first decoder in order to transmit to the first decoder the so-called extrinsic information produced by the second decoder.

The turbodecoder 300 receives the encoded sequences a, b' and c' coming from a receiver 1106 (see FIG. 6 described below). Once the decoding has terminated, the sequence â, which is an estimation of the sequence a transmitted by the transmitter 906, is sent to a truncating module 335. This truncator 335, according to the invention, produces a sequence û by removing the last d bits from â, corresponding to the padding bits added before encoding. Finally, this sequence û is sent to an information recipient 1110.

Figure 6:
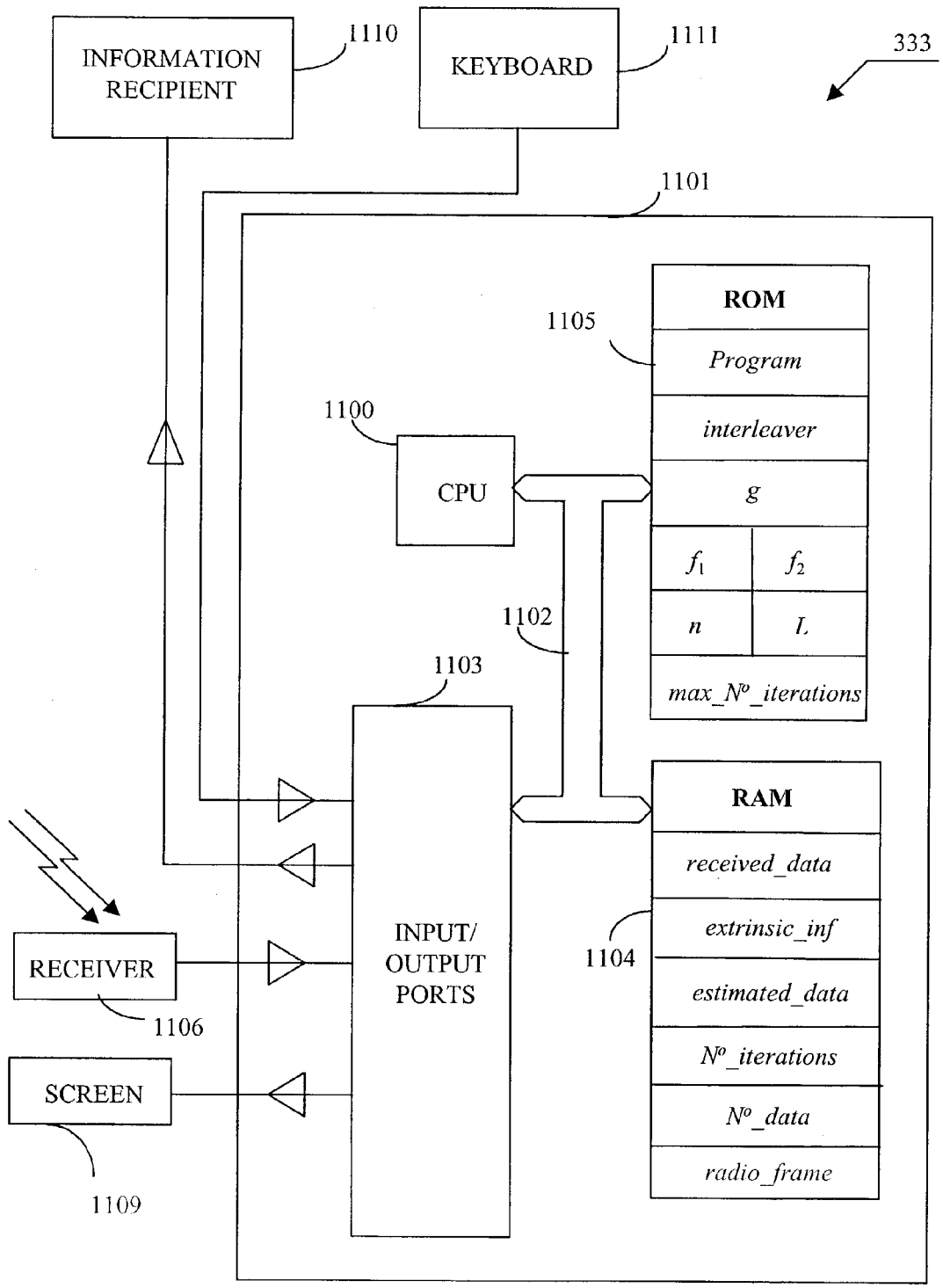
FIG. 6 is a diagram of a digital signal reception apparatus according to a particular embodiment of the invention.

The synoptic diagram of FIG. 6 represents an apparatus for receiving digital signals 333 incorporating the device of FIG. 5. It comprises a keyboard 1111, a screen 1109, a recipient of external information 1110, a radio receiver 1106, conjointly connected to input/output ports 1103 of a decoding device 1101 which is produced here in the form of a logic unit.

The decoding device 1101 has, connected together by an address and data bus 1102:
- a central processing unit 1100,
- a random access memory RAM 1104,
- a read only memory 1105, and
- said input/output ports 1103.

Each of the elements illustrated in FIG. 6 is well known to a person skilled in the art of microcomputers and transmission systems and, more generally, of information processing systems. These known elements are therefore not described here. It should be noted, however, that:
- the information recipient 1110 could, for example, be an interface peripheral, a display, a modulator, an external memory or other information processing system (not shown), and could be adapted to receive sequences of signals representing speech, service messages or multimedia data in particular of IP or ATM type, in the form of sequences of binary data,
- the radio receiver 1106 is adapted to implement a packet transmission protocol on a wireless channel, and to transmit these packets over such a channel.

The random access memory 1104 stores data, variables and intermediate processing results, in memory registers bearing, in the description, the same names as the data whose values they store. The random access memory 1104 contains in particular the following registers:
- a register "received_data", in which there are respectively stored the received sequences a', b', and c',
- a register "extrinsic_inf", in which there are respectively stored the intermediate decoding sequences output from the Decoder 2 of FIG. 5,
- a register "estimated_data", in which there are stored the decoded sequence â and the corresponding interleaved sequence â*,
- a register "N⁰_iterations", in which there is stored the value of the number of iterations already made by the turbodecoder, a register "N⁰_data" in which there is stored the length of the sequence $\hat{u}$ issuing from the truncator 335, and a register "radio_frame" in which there is stored the entire radio frame received.

The read only memory 1105 is adapted to store, in registers which, for convenience, have the same names as the data which they store:

the operating program of the central processing unit 1100, in a register "Program", the coefficients of the polynomial g(x), in a register "g", the coefficients of the polynomial $f_1(x)$, in a register "$f_1$", the coefficients of the polynomial $f_2(x)$, in a register "$f_2$", the length of the sequences $\underline{a}$ and $\underline{a}^*$, in a register "n", the permutation defining the interleaver, in a register "interleaves", the value L of the period of g in a register "L", and the maximum number of iterations in a register "max_N⁰_iterations".

In certain applications, it is convenient to use the same computer device (operating in multitask mode) for the transmission and reception of signals according to the invention. In this case, the units 901 (FIG. 4) and 1101 (FIG. 6) are physically identical.

Figure 7:
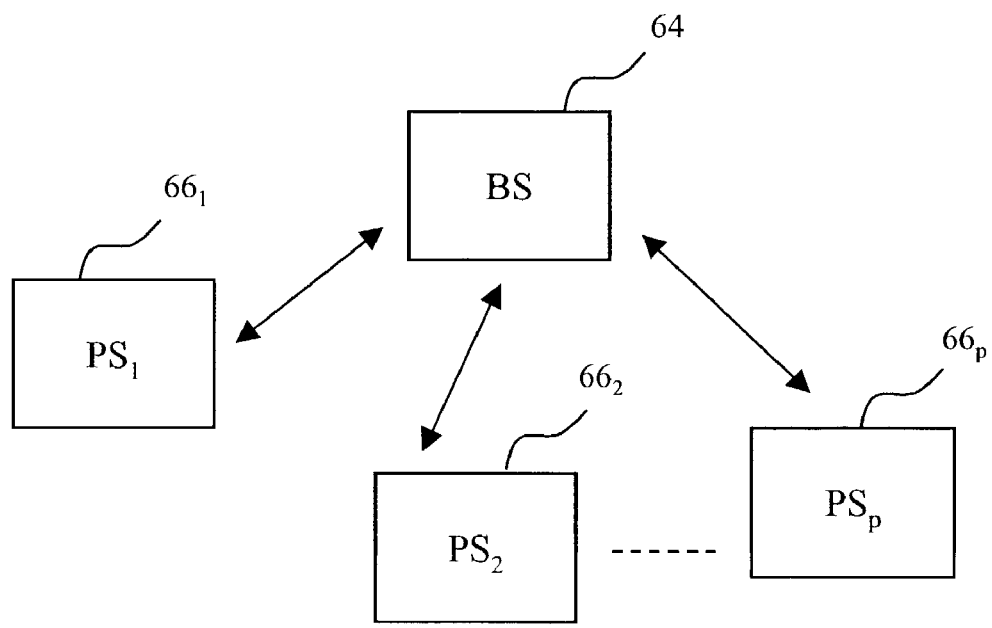
FIG. 7 is a diagram of an embodiment of a wireless telecommunications network liable to implement the invention.

The method according to the invention may be implemented within a telecommunications network, as FIG. 7 shows. The network shown, which may for example be constituted by one of the future communication networks such as the UMTS networks, is constituted by a so-called base station BS designated by reference 64, and several peripheral stations $PS_i$, i=1, . . . , p, where p is an integer greater than or equal to 1, respectively designated by the references $66_1$, $66_2$, . . . , $66_p$. The peripheral stations $66_1$, $66_2$, . . . , $66_p$ are remote from the base station BS, each connected by a radio link with the base station BS and liable to move with respect to the latter.

The base station BS and each peripheral station $PS_i$ can comprise an encoding device 901 as described with reference to FIGS. 4, 5 and 6, a transmission unit and a radio module provided with a conventional transmitter comprising one or more modulators, filters and an antenna.

The base station BS and each peripheral station $PS_i$ according to the invention can also comprise a decoding device 1101 as described with reference to FIGS. 5 and 6, a reception unit and a radio module with its antenna.

The base station BS and the peripheral stations $PS_i$ can further comprise, according to requirements, a digital moving picture camera, a computer, a printer, a server, a facsimile machine, a scanner or a digital camera, these examples being non-limiting.

The invention claimed is:

1. A method of interleaving a binary data sequence $\underline{a}$ represented by a polynomial $$a(x) = \sum_{i=0}^{n-1} a_i x^i,$$

n being a product of two integers R and M such that R≧M, i being an integer which may be written i=r.M+c, r being a non-negative integer and c being an integer in the interval [0, M−1], said method comprising obtaining, from the sequence $\underline{a}$, an interleaved binary data sequence $\underline{a}^*$ represented by a polynomial $$a^*(x) = \sum_{i=0}^{n-1} a_i x^{i^*}$$

where i*=[r−h(c)].M+c mod n, the numbers h(c) being obtained by:

the choice of an M-tuple $\underline{h}_0=[h_0(0), \ldots, h_0(M-1)]$ of non-negative integers less than R−1 such that, given a predetermined set Π of circulating matrices P of dimensions M×M, for any matrix P of Π, the residues modulo R of the components of the vector $\underline{h}_0.P$ are not nil; and the corresponding choice of an M-tuple $\underline{h}=[h(0), \ldots, h(M-1)]$ obtained from the M-tuple $\underline{h}_0$ by the application of a permutation moving the element $h_0(c)$ to position L×c mod M, L being an integer relatively prime with M.

2. A method according to claim 1, wherein the set Π contains circulating matrices $P_1$ and $P_2$ such that:

the first column of $P_1$ is $[1-2\ 1\ 0\ \ldots\ 0]^T$ and the first column of $P_2$ is $[2-2\ 0\ 0\ \ldots\ 0]^T$, where $^T$ designates the transposition.

3. A method according to claim 1, wherein the set Π contains circulating matrices $P_3$ to $P_8$ such that:

the first column of $P_3$ is $[1-1-1\ 1\ 0\ \ldots\ 0]^T$, the first column of $P_4$ is $[1-1\ 1-1\ 0\ \ldots\ 0]^T$, the first column of $P_5$ is $[1\ 0-2\ 1\ 0\ \ldots\ 0]^T$, the first column of $P_6$ is $[1-2\ 0\ 1\ 0\ \ldots\ 0]^T$, the first column of $P_7$ is $[2-1-1\ 0\ 0\ \ldots\ 0]^T$ and the first column of $P_8$ is $[1\ 1-2\ 0\ 0\ \ldots\ 0]^T$, where $^T$ designates the transposition.

4. A method according to claim 1, wherein the set Π contains circulating matrices $P_9$ to $P_{20}$ such that:

the first column of $P_9$ is $[1\ 1-1-1\ 0\ \ldots\ 0]^T$, the first column of $P_{10}$ is $[1-1\ 0\ 1-1\ 0\ \ldots\ 0]^T$, the first column of $P_{11}$ is $[1-1\ 0-1\ 1\ 0\ \ldots\ 0]^T$, the first column of $P_{12}$ is $[1\ 0-1-1\ 1\ 0\ \ldots\ 0]^T$, the first column of $P_{13}$ is $[1-1-1\ 0\ 1\ 0\ \ldots\ 0]^T$, the first column of $P_{14}$ is $[1\ 0-1\ 1-1\ 0\ \ldots\ 0]^T$, the first column of $P_{15}$ is $[1-1\ 1\ 0-1\ 0\ \ldots\ 0]^T$, the first column of $P_{16}$ is $[1\ 0-2\ 0\ 1\ 0\ \ldots\ 0]^T$, the first column of $P_{17}$ is $[1\ 0\ 0-2\ 1\ 0\ \ldots\ 0]^T$, the first column of $P_{18}$ is $[1-2\ 0\ 0\ 1\ 0\ \ldots\ 0]^T$, the first column of $P_{19}$ is $[1\ 0\ 1-2\ 0\ 0\ \ldots\ 0]^T$ and the first column of $P_{20}$ is $[2-1\ 0-1\ 0\ 0\ \ldots\ 0]^T$, where $^T$ designates the transposition.

5. A method according to claim 1, wherein the set Π contains circulating matrices $P_{21}$ to $P_{24}$ such that:

the first column of $P_{21}$ is $[1-3\ 2\ 0\ 0\ \ldots\ 0]^T$, the first column of $P_{22}$ is $[2-3\ 1\ 0\ 0\ \ldots\ 0]^T$, the first column of $P_{23}$ is $[1-2\ 2-1\ 0\ \ldots\ 0]^T$ and the first column of $P_{24}$ is $[3-3\ 0\ 0\ 0\ \ldots\ 0]^T$, where $^T$ designates the transposition.

6. A method according to claim 1, wherein the set Π contains circulating matrices $P_1$ to $P_8$ such that:

the first column of $P_1$ is $[1-2\ 1\ 0\ \ldots\ 0]^T$, the first column of $P_2$ is $[2-2\ 0\ 0\ \ldots\ 0]^T$, the first column of $P_3$ is $[1-1-1\ 1\ 0\ \ldots\ 0]^T$, the first column of $P_4$ is $[1-1-1\ 0\ \ldots\ 0]^T$, the first column of $P_5$ is $[1\ 0-2\ 1\ 0\ \ldots\ 0]^T$, the first column of $P_6$ is $[1-2\ 0\ 1\ 0\ \ldots\ 0]^T$, the first column of $P_7$ is $[2-1-1\ 0\ 0\ \ldots\ 0]^T$ and the first column of $P_8$ is $[1\ 1-2\ 0\ 0\ \ldots\ 0]^T$, where $^T$ designates the transposition.

7. A method according to claim 1, wherein the set Π contains circulating matrices $P_1$ to $P_{20}$ such that:
the first column of $P_1$ is $[1\text{-}2\ 1\ 0\ \ldots\ 0]^T$,
the first column of $P_2$ is $[2\text{-}2\ 0\ 0\ \ldots\ 0]^T$,
the first column of $P_3$ is $[1\text{-}1\text{-}1\ 1\ 0\ \ldots\ 0]^T$,
the first column of $P_4$ is $[1\text{-}1\ 1\text{-}1\ 0\ \ldots\ 0]T$,
the first column of $P_5$ is $[1\ 0\text{-}2\ 1\ 0\ \ldots\ 0]T$,
the first column of $P_6$ is $[1\text{-}2\ 0\ 1\ 0\ \ldots\ 0]T$,
the first column of $P_7$ is $[2\text{-}1\text{-}1\ 0\ 0\ \ldots\ 0]^T$,
the first column of $P_8$ is $[1\ 1\text{-}2\ 0\ 0\ \ldots\ 0]^T$,
the first column of $P_9$ is $[1\ 1\text{-}1\text{-}1\ 0\ \ldots\ 0]^T$,
the first column of $P_{10}$ is $[1\text{-}1\ 0\ 1\text{-}1\ 0\ \ldots\ 0]^T$,
the first column of $P_{11}$ is $[1\text{-}1\ 0\text{-}1\ 1\ 0\ \ldots\ 0]^T$,
the first column of $P_{12}$ is $[1\ 0\text{-}1\text{-}1\ 1\ 0\ \ldots\ 0]^T$,
the first column of $P_{13}$ is $[1\text{-}1\text{-}1\ 0\ 1\ 0\ \ldots\ 0]^T$,
the first column of $P_{14}$ is $[1\ 0\text{-}1\ 1\text{-}1\ 0\ \ldots\ 0]^T$,
the first column of $P_{15}$ is $[1\text{-}1\ 1\ 0\text{-}1\ 0\ \ldots\ 0]^T$,
the first column of $P_{16}$ is $[1\ 0\text{-}2\ 0\ 1\ 0\ \ldots\ 0]^T$,
the first column of $P_{17}$ is $[1\ 0\ 0\text{-}2\ 1\ 0\ \ldots\ 0]^T$,
the first column of $P_{18}$ is $[1\text{-}2\ 0\ 0\ 1\ 0\ \ldots\ 0]^T$,
the first column of $P_{19}$ is $[1\ 0\ 1\text{-}2\ 0\ 0\ \ldots\ 0]^T$ and
the first column of $P_{20}$ is $[2\text{-}1\ 0\text{-}1\ 0\ 0\ \ldots\ 0]^T$,
where $^T$ designates the transposition.

8. A method according to claim 1, wherein the set Π contains circulating matrices $P_1$ to $P_{24}$ such that:
the first column of $P_1$ is $[1\text{-}2\ 1\ 0\ \ldots\ 0]^T$,
the first column of $P_2$ is $[2\text{-}2\ 0\ 0\ \ldots\ 0]^T$,
the first column of $P_3$ is $[1\text{-}1\text{-}1\ 1\ 0\ \ldots\ 0]^T$,
the first column of $P_4$ is $[1\text{-}1\ 1\text{-}1\ 0\ \ldots\ 0]^T$,
the first column of $P_5$ is $[1\ 0\text{-}2\ 1\ 0\ \ldots\ 0]^T$,
the first column of $P_6$ is $[1\text{-}2\ 0\ 1\ 0\ \ldots\ 0]^T$,
the first column of $P_7$ is $[2\text{-}1\text{-}1\ 0\ 0\ \ldots\ 0]^T$,
the first column of $P_8$ is $[1\ 1\text{-}2\ 0\ 0\ \ldots\ 0]^T$,
the first column of $P_9$ is $[1\ 1\text{-}1\text{-}1\ 0\ \ldots\ 0]^T$,
the first column of $P_{10}$ is $[1\text{-}1\ 0\ 1\text{-}1\ 0\ \ldots\ 0]^T$,
the first column of $P_{11}$ is $[1\text{-}1\ 0\text{-}1\ 1\ 0\ \ldots\ 0]^T$,
the first column of $P_{12}$ is $[1\ 0\text{-}1\text{-}1\ 1\ 0\ \ldots\ 0]^T$,
the first column of $P_{13}$ is $[1\text{-}1\text{-}1\ 0\ 1\ 0\ \ldots\ 0]^T$,
the first column of $P_{14}$ is $[1\ 0\text{-}1\text{-}1\ 0\ \ldots\ 0]T$,
the first column of $P_{15}$ is $[1\text{-}1\ 1\ 0\text{-}1\ 0\ \ldots\ 0]^T$,
the first column of $P_{16}$ is $[1\ 0\text{-}2\ 0\ 1\ 0\ \ldots\ 0]^T$,
the first column of $P_{17}$ is $[1\ 0\ 0\text{-}2\ 1\ 0\ \ldots\ 0]^T$,
the first column of $P_{18}$ is $[1\text{-}2\ 0\ 0\ 1\ 0\ \ldots\ ]^T$,
the first column of $P_{19}$ is $[1\ 0\ 1\text{-}2\ 0\ 0\ \ldots\ 0]^T$,
the first column of $P_{20}$ is $[2\text{-}1\ 0\text{-}1\ 0\ 0\ \ldots\ 0]^T$,
the first column of $P_{21}$ is $[1\text{-}3\ 2\ 0\ 0\ \ldots\ 0]^T$,
the first column of $P_{22}$ is $[2\text{-}3\ 1\ 0\ 0\ \ldots\ 0]^T$,
the first column of $P_{23}$ is $[1\text{-}2\ 2\text{-}1\ 0\ \ldots\ 0]^T$ and
the first column of $P_{24}$ is $[3\text{-}3\ 0\ 0\ 0\ \ldots\ 0]^T$,
where $^T$ designates the transposition.

9. A method according to claim 1, wherein the set Π contains circulating matrices $P_1$, $P_2$ and $P_{21}$ to $P_{24}$ such that:
the first column of $P_1$ is $[1\text{-}2\ 1\ 0\ \ldots\ 0]^T$,
the first column of $P_2$ is $[2\text{-}2\ 0\ 0\ \ldots\ 0]^T$,
the first column of $P_{21}$ is $[1\text{-}3\ 2\ 0\ 0\ \ldots\ 0]^T$,
the first column of $P_{22}$ is $[2\text{-}3\ 1\ 0\ 0\ \ldots\ 0]^T$,
the first column of $P_{23}$ is $[1\text{-}2\ 2\text{-}1\ 0\ \ldots\ 0]^T$ and
the first column of $P_{24}$ is $[3\text{-}3\ 0\ 0\ 0\ \ldots\ 0]^T$,
where $^T$ designates the transposition.

10. A method according to claim 1, wherein the set Π contains circulating matrices $P_1$ to $P_8$ and $P_{21}$ to $P_{24}$ such that:
the first column of $P_1$ is $[1\text{-}2\ 1\ 0\ \ldots\ 0]^T$,
the first column of $P_2$ is $[2\text{-}2\ 0\ 0\ \ldots\ 0]^T$,
the first column of $P_3$ is $[1\text{-}1\text{-}1\ 1\ 0\ \ldots\ 0]^T$,
the first column of $P_4$ is $[1\text{-}1\ 1\text{-}1\ 0\ \ldots\ 0]^T$,
the first column of $P_5$ is $[1\ 0\text{-}2\ 1\ 0\ \ldots\ 0]^T$,
the first column of $P_6$ is $[1\text{-}2\ 0\ 1\ 0\ \ldots\ 0]^T$,
the first column of $P_7$ is $[2\text{-}1\text{-}1\ 0\ 0\ \ldots\ 0]^T$,
the first column of $P_8$ is $[1\ 1\text{-}2\ 0\ 0\ \ldots\ 0]^T$,
the first column of $P_{21}$ is $[1\text{-}3\ 2\ 0\ 0\ \ldots\ 0]^T$,
the first column of $P_{22}$ is $[2\text{-}3\ 1\ 0\ 0\ \ldots\ 0]^T$,
the first column of $P_{23}$ is $[1\text{-}2\ 2\text{-}1\ 0\ \ldots\ 0]^T$ and
the first column of $P_{24}$ is $[3\text{-}3\ 0\ 0\ 0\ \ldots\ 0]^T$,
where $^T$ designates the transposition.

11. A method of encoding for the transmission of information, implementing an interleaving method according to claim 1, and wherein:
an integer L is the period which is common to predetermined first and second polynomials with binary coefficients g(x) and g*(x) and of degree d and of constant term equal to 1;
the information is presented in the form of binary sequences $\underline{u}$ of length l=n−2d, where n is a predetermined multiple of L; and
for each of the sequences $\underline{u}$, a triplet $\underline{v}$ is produced of binary sequences $\underline{a},\underline{b},\underline{c}$ intended to be transmitted and obtained as follows:
the sequence $\underline{b}$ is represented by the polynomial b(x)=a(x).f₁(x)/g(x), where f₁(x) is a second predetermined polynomial with binary coefficients, not having a common divisor with g(x),
the sequence $\underline{c}$ is represented by the polynomial c(x)=a*(x).f₂(x)/g*(x), where f₂(x) is a third predetermined polynomial with binary coefficients, not having a common divisor with g*(x), and where a*(x) is a polynomial associated with a sequence $\underline{a}$* produced by interleaving of the sequence $\underline{a}$, and
the sequence $\underline{a}$ is of length n and is obtained by inserting 2d padding bits in the sequence $\underline{u}$ in order that the polynomial $$a(x) = \sum_{i=0}^{n-1} a_i x^i$$

associated with $\underline{a}$ be divisible by g(x) and that the polynomial a*(x) be divisible by g*(x).

12. An encoding method according to claim 11, wherein the first and second polynomials g(x) and g*(x) are identical.

13. A decoding method, including the decoding of received sequences which were transmitted after having been encoded by an encoding method according to claim 11.

14. A device for encoding sequences of data intended to be transmitted, the sequences being encoded by an encoding method according to claim 11, said device comprising:
means for obtaining, for each sequence of data $\underline{u}$, said sequence $\underline{a}$ associated with $\underline{u}$ by inserting said 2d padding bits in the sequence $\underline{u}$, and
at least one encoder comprising an interleaver capable of performing the permutation provided for in said interleaving method.

15. A decoding device intended to implement a decoding method according to claim 13, comprising:
at least one decoder comprising two interleavers capable of performing the permutation provided for in said interleaving method, and a deinterleaver adapted to reverse that permutation, and
means for producing a binary sequence $\underline{\hat{u}}$ by removing 2d bits from an estimated sequence $\underline{\hat{a}}$ obtained at the issue of the decoding of sequences $\underline{a}'$, $\underline{b}'$ and $\underline{c}'$ received corresponding respectively to the transmitted sequences a, b and c, the 2d bits to be removed corresponding to the 2d bits inserted in the sequence u to obtain the sequence a.

16. Apparatus for transmitting encoded digital signals, comprising an encoding device according to claim 14 and having means for transmitting the encoded sequences a, b, and c.

17. Apparatus for receiving encoded digital signals, comprising a decoding device according to claim 15 and comprising means for receiving the sequences a', b', and c'.

18. Telecommunications network, comprising at least one transmission apparatus according to claim 16.

19. Telecommunications network, comprising at least one reception apparatus according to claim 17.

20. A base station in a telecommunications network, comprising at least one transmission apparatus according to claim 16.

21. A base station in a telecommunications network, comprising at least one reception apparatus according to claim 17.

22. A mobile station in a telecommunications network, comprising at least one transmission apparatus according to claim 16.

23. A mobile station in a telecommunications network, comprising at least one reception apparatus according to claim 17.

24. An information storage medium, which can be read by a computer or a microprocessor storing instructions of a computer program, making it possible to implement an interleaving method according to claim 1.

25. An information storage medium, which can be read by a computer or a microprocessor storing instructions of a computer program, making it possible to implement an encoding method according to claim 11.

26. An information storage medium, which can be read by a computer or a microprocessor storing instructions of a computer program, making it possible to implement a decoding method according to claim 13.

27. A partially or entirely removable information storage medium, which can be read by a computer or a microprocessor storing instructions of a computer program, making it possible to implement an interleaving method according to claim 1.

28. A partially or entirely removable information storage medium, which can be read by a computer or a microprocessor storing instructions of a computer program, making it possible to implement an encoding method according to claim 11.

29. A partially or entirely removable information storage medium, which can be read by a computer or a microprocessor storing instructions of a computer program, making it possible to implement a decoding method according to claim 13.

30. A computer program product stored in a computer-readable storage medium, and comprising sequences of instructions to implement an interleaving method according to claim 1.

31. A computer program product stored in a computer-readable storage medium, and comprising sequences of instructions to implement an encoding method according to claim 11.

32. A computer program product stored in a computer-readable storage medium, and comprising sequences of instructions to implement a decoding method according to claim 13.

* * * * *

UNITED STATES PATENT AND TRADEMARK OFFICE
CERTIFICATE OF CORRECTION

PATENT NO.        : 7,069,492 B2
APPLICATION NO. : 10/386722
DATED             : June 27, 2006
INVENTOR(S)       : Philippe Piret It is certified that error appears in the above-identified patent and that said Letters Patent is hereby corrected as shown below:

ON THE TITLE PAGE [57] ABSTRACT:

Lines 16-19, "(It is noted that the above underlining of the variables, and the above single bracketing, is in the original and is meant to be permanent.)" should be deleted.

COLUMN 2:

Line 66, "of a" should read --of a--.

COLUMN 3:

Line 1, "ts" should read --bits--; and
Line 31, "permuntation" should read --permutation--.

COLUMN 6:

Line 29, "of" should read --if--.

COLUMN 7:

Line 17, "(i,j)∉I" should read --(i,j) $\notin$ I--;
Line 19, "(i,j)∈I." should read --(i,j) $\in$ I--;
Line 22, "(i,j) ∉ I" should read --(i,j) $\in$ I--;
Line 23, "(i,j) ∈ I." should read --(i,j) $\notin$ I.--;
Line 24, "7x7is" should read --7x7 is--; and
Line 45, "$\alpha f_1(i)+f^0(i)$" should read --$\alpha f_1(i)+f_0(i)$--.

COLUMN 9:

Line 13, "$[2\text{-}1\ 0\ 1\ 0\ 0\ \ldots\ 0]^T$." should read --$[2\text{-}1\ 0\text{-}1\ 0\ 0\ \ldots\ 0]^T$.--.

COLUMN 10:

Line 36, "sequence a" should read --sequence â--.

UNITED STATES PATENT AND TRADEMARK OFFICE
CERTIFICATE OF CORRECTION

PATENT NO. : 7,069,492 B2
APPLICATION NO. : 10/386722
DATED : June 27, 2006
INVENTOR(S) : Philippe Piret It is certified that error appears in the above-identified patent and that said Letters Patent is hereby corrected as shown below:

COLUMN 13:

Line 52, "h" should read --$\underline{h}$--.

COLUMN 14:

Line 55, "$2/h(c+7)-h(c)]\equiv 0 \bmod R$ (33)"
should read
--$2/h(c+7)-h(c)]\equiv 0 \bmod R$         (33)--.

COLUMN 15:

Line 20, "et" should read --and--;
Line 49, "$|j-i|+|j^*-i^*|\geq M\ |h(d)|h(c)|$." should read
--$|j-i|+|j^*-i^*|\geq M\ |h(d)-h(c)|$.--; and
Line 52, "$u\geq 0$," should read --$u>0$,--.

COLUMN 16:

Line 36, "ho" should read --$\underline{h}_0$--;
Line 43, "element $\underline{h}_0(i)$" should read --element $h_0(i)$--; and
Line 44, "11-tuple h" should read --11-tuple $\underline{h}$--.

COLUMN 17:

Line 63, ""interleaves"," should read --"interleaver",--.

COLUMN 18:

Line 14, "sequences $\underline{a}$," should read --sequences $\underline{a}'$,--; and
Line 15, "c'" should read --$\underline{c}'$--.

COLUMN 19:

Line 15, ""interleaves"," should read --"interleaver",--.

UNITED STATES PATENT AND TRADEMARK OFFICE
CERTIFICATE OF CORRECTION

PATENT NO. : 7,069,492 B2
APPLICATION NO. : 10/386722
DATED : June 27, 2006
INVENTOR(S) : Philippe Piret It is certified that error appears in the above-identified patent and that said Letters Patent is hereby corrected as shown below:

COLUMN 20:

Line 61, "$[1\text{-}1\text{-}1\ 0\ \ldots\ 0]^T$," should read --$[1\text{-}1\ 1\text{-}1\ 0\ \ldots\ 0]^T$,--.

COLUMN 21:

Line 39, "$[1\ 0\text{-}1\text{-}1\ 0\ \ldots\ 0]^T$." should read --$[1\ 0\text{-}1\ 1\text{-}1\ 0\ \ldots\ 0]^T$,--.

Signed and Sealed this

Sixth Day of January, 2009

JON W. DUDAS
*Director of the United States Patent and Trademark Office*